United States Patent [19]

Riley et al.

[11] 4,123,264
[45] Oct. 31, 1978

[54] PRODUCTION OF FERROUS BODIES

[75] Inventors: Ralph V. Riley, Stamford; Samuel Muir, Nr. Market Harborough; Christopher Bloor, Corby; Tibor Jozsef, Gretton, all of England

[73] Assignee: British Steel Corporation, United Kingdom

[21] Appl. No.: 458,601

[22] Filed: Apr. 8, 1974

[51] Int. Cl.² ............................................. B22F 1/00
[52] U.S. Cl. ................................................... 75/211
[58] Field of Search ............... 75/34, 0.5 B, 0.5 BA, 75/84.5, 211, 214, 129; 266/24

[56] References Cited

U.S. PATENT DOCUMENTS

| | | | |
|---|---|---|---|
| 2,762,700 | 9/1956 | Brooks | 75/34 |
| 2,870,007 | 1/1959 | Boettcher et al. | 75/84.5 |
| 3,416,914 | 12/1968 | Guerrieri | 75/34 |
| 3,450,525 | 6/1969 | Van Den Steen | 75/84.5 |

Primary Examiner—M. J. Andrews
Attorney, Agent, or Firm—Nolte and Nolte

[57] ABSTRACT

The production of a ferrous body including reacting an iron compound in a gaseous state with a reducing gas, and depositing iron produced thereby on a former which is maintained at a temperature and under conditions such that the iron is deposited as a solid body.

21 Claims, 2 Drawing Figures

PRODUCTION OF FERROUS BODIES

This invention relates to the production of ferrous bodies.

According to one aspect of the present invention there is provided a method of producing a ferrous body comprising reacting an iron compound in a gaseous state with a reducing gas, and depositing iron produced thereby on a former maintained at a temperature and under conditions such that the iron is deposited as a solid body.

According to another aspect of the present invention there is provided a method of producing a ferrous body comprising reacting an iron compound in a gaseous state with a reducing gas, and depositing iron produced thereby on a former maintained at least at the reduction temperature of the reaction and under turbulent gas flow conditions whereby the iron is deposited as a solid body.

The invention is particularly, although not exclusively, concerned with the production of solid bodies of iron directly from iron ore, sintered ore, mill scale, iron scrap or the like (hereinafter referred to as "iron bearing material"), and in this case the invention includes the step of converting the iron bearing material directly to the iron compound in a gaseous state.

The temperature at which the former is maintained is determined by the requirement that the iron atoms when produced are mobile and hence agglomerate to produce a solid body of iron.

It is known that a metallic surface completely free of all impurities (e.g. oxides and nitrides) is very reactive. We believe that the method of the present invention produces such a surface on the former, and that this surface therefore has a high affinity for iron atoms freshly produced from the gas phase. In addition by maintaining a temperature at the former such that these iron atoms are mobile, they tend to diffuse along the surface causing individual "islands" of iron to link up and produce a coherent layer. A further important feature is that we have found that with our process, the iron is deposited in a crystaline form, and is not amorphous.

The temperature of the former is preferably maintained within the range 600° to 700° C.

The reduction step during which iron is deposited on the former, takes place under turbulent gas flow conditions. We believe this to be important firstly to increase the efficiency of the reaction between the gaseous iron compound and the reducing gas, and secondly because we believe that under turbulent flow conditions the formation of a solid body of iron as a coherent layer on the former is strongly favoured, probably because of the greater frequency of collision between freshly produced iron atoms and the former under these conditions.

The iron compound may be an iron salt.

In one form of the invention the iron bearing material is reacted at an elevated temperature in a first chamber with hydrogen chloride gas to produce ferric or ferrous chloride gas which is passed to a second chamber for reaction, again at an elevated temperature, with a reducing gas such as hydrogen, so as to produce metallic iron and hydrogen chloride gas. In practice the hydrogen gas may be derived from any convenient source such as natural gas or coke oven gas.

In this form of the invention means are preferably provided for recovering and recycling at least the majority of the hydrogen chloride gas.

Similarly means may be provided for recovering hydrogen chloride remaining combined in the spent iron bearing material, such as calcium chloride, for re-use in the process.

As one alternative to using hydrogen chloride gas in the first chamber, chlorine gas may be used.

In some cases, were the iron bearing material is iron ore for example, it may be necessary or desirable to prepare the material for processing by roasting it at 400°–500° C to oxidise it fully and to eliminate moisture and carbon dioxide therefrom.

We have found that in the chlorinating step a considerable excess of the gas is required for thermodynamic equilibrium compared to the theoretical requirements called for by the reaction equation.

This excess can be reduced if the iron ore is pretreated with hydrogen chloride gas at a lower temperature (e.g. 150° C) at which the metal chloride product is not gaseous before reacting the gas and the ore at a higher temperature (e.g. 400° C – 500° C) at which the ferric chloride produced is gaseous. As an example we have found in one case that by such a pretreatment the excess of hydrogen chloride gas required for satisfactory reaction compared to the theoretical requirement was reduced from 17 times to 11 times.

Again, as an alternative, it is possible to have a single chlorinating step at about 800° C, using two parts hydrogen chloride gas to one part hydrogen gas. We have found that this alternative gives very good yields.

In the reduction step, the temperature of the gases is maintained at 600° C or above and in one example we have carried out the reduction step at 625° C using a 10:1 ratio of hydrogen to ferric chloride.

One iron bearing material which can be used for processing by the invention is sintered iron ore. In this case reaction with hydrogen chloride gas produces ferrous chloride as against ferric chloride with fully oxidised ore, and to ensure that the ferrous chloride is gaseous requires a temperature in the chlorinating step of at least about 1000° C. However if the sintered ore is subjected to treatment by means of the invention straight from its production plant, it is already at a temperature of this order. An advantage we have found in using sintered ore is that a lower excess of hydrogen chloride is required when dealing with the ferrous oxide present in sinter than is required for dealing with the ferric oxide of iron ore and the like. In addition less hydrogen is required for reduction since the iron is in a more reduced state before the reduction step than is so with ferric chloride.

The invention may be used for producing alloy irons. Thus scrap or substances containing the required additive metal or metal compound can be added to the iron bearing material before processing provided the compound of the substance produced by the compound producing reaction is gaseous at the temperature of the reaction so that it is carried with the gaseous iron compound for subsequent reduction. This is true, for example of chromium, molybdenum, tungsten, vanadium and manganese chlorides, so that where hydrogen chloride or chlorine gas is used for the reaction with the iron bearing material, these metals can be included as required for alloying.

Alternatively or in addition gaseous compounds of additive metals or other materials (such as carbon or nitrogen) can be added to the gaseous iron compound immediately prior to the reduction step.

Alternatively carbon, for example, can be introduced by passing hydrogen gas to be used in the reduction over paraffin oil, for example whereby hydro-carbon vapour is introduced into the gas stream. This is decomposed to carbon and hydrogen in the reduction chamber and forms iron carbide particles in the deposited iron. By heat treatment normal pearlite and ferrite phases can be produced in the iron body.

In order to reduce the size of plant needed to produce iron in practical commercial quantities, the process of the present invention may be carried out at super-atmospheric pressure.

According to a further aspect of the present invention there is provided apparatus for producing a ferrous body including a reduction reaction chamber; an inlet to the chamber for an iron compound in a gaseous state; an inlet jet projecting into the chamber for the supply of a reducing gas thereinto; the chamber, inlet, and inlet jet being so shaped and disposed as to provide turbulent flow conditions within the chamber; a former located within the chamber to receive the deposition of a solid ferrous body thereon; and means for maintaining the former at the reduction reaction temperature.

The reduction reaction chamber, the inlet, and the inlet jet may be so shaped and disposed that the reduction reaction takes place away from the inlet and inlet jet thereby removing the risk of the inlet or inlet jet becoming blocked by metal deposition.

The former may consist of a member from which the body can be removed after deposition. Alternatively the former may consist of a member upon which it is desired to deposit a layer of iron to produce a composite member.

The deposition of iron may be on a 'batch' basis or may be continuous. This in some cases an individually shaped body may be produced on the former and then removed to enable another body to be produced, whilst in other cases, when producing tube for example, the former may comprise a starter tube which is withdrawn continuously from the reduction chamber as deposition of the ferrous body in the form of a tube proceeds.

The invention includes within its scope ferrous bodies made in accordance with the method of the invention.

In order that the invention may be more fully understood reference will now be made to the accompanying drawings in which.

Figure 1:
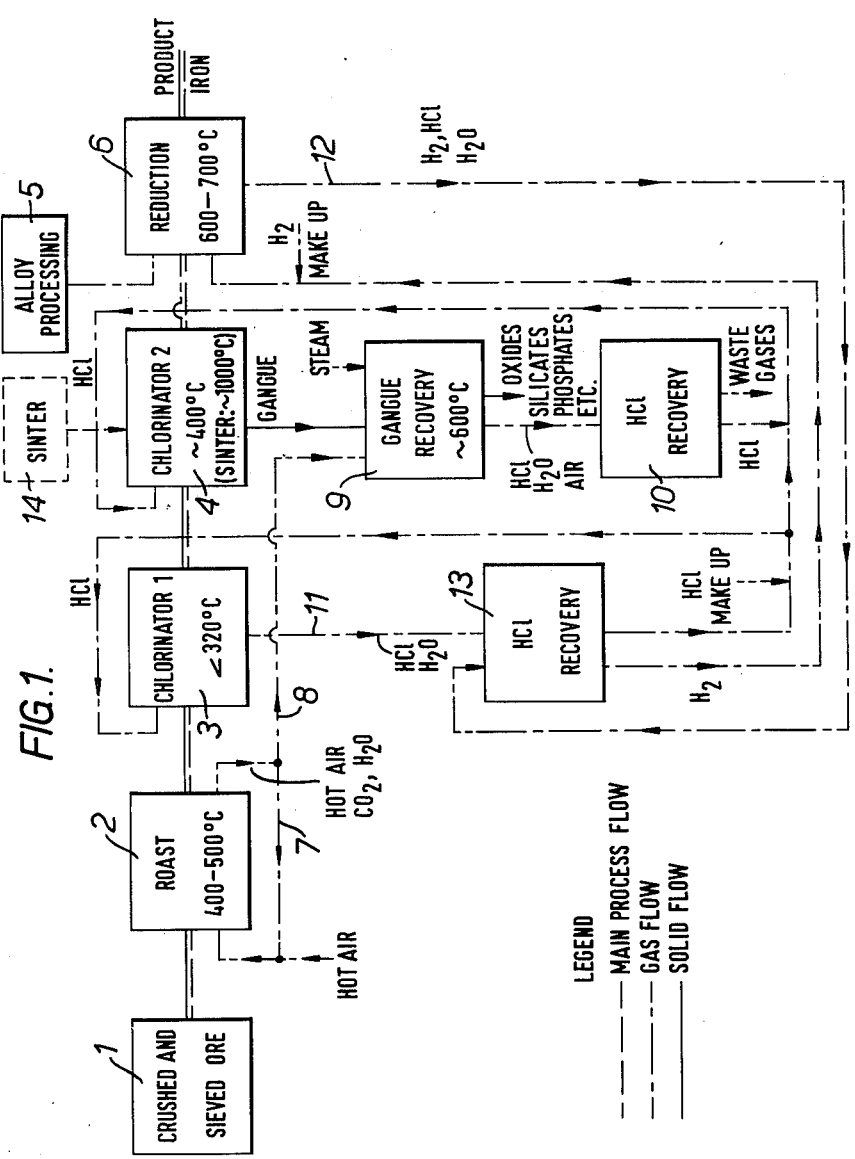
FIG. 1 shows a typical flow diagram of one embodiment of the invention.

As shown at 1 in FIG. 1 the starting material for the process is crushed and sieved iron ore. This is roasted, at 400°–500° C at 2 to oxidise fully the ore to ferric oxide and to remove moisture and carbon dioxide from the ore.

At 3 the ore is subjected to a first chlorinating step by passing hydrogen chloride gas over the ore at a temperature less than 320° C so as to convert some of the ore to ferric chloride at a temperature below the boiling temperature thereof and to remove at least some volatile impurities.

The partially chlorinated ore is then subjected at 4 again to hydrogen chloride gas, this time at about 400° C at which temperature the ferric chloride produced is in a gaseous condition.

The gas flowing from the second chlorinating step has added to it gaseous products of an alloy processing unit 5, and hydrogen gas, and the gases are reacted at 6 at 600°–700° C to reduce the ferric chloride to a solid body of iron on a former, and similarly to reduce the gaseous products of the alloy processing unit 5 so as to produce the required alloy constituents of the iron.

FIG. 1 shows the ancillary processing flow in addition to the main production flow described above. It is important commercially that as little hydrogen chloride gas and hydrogen as possible are wasted, so that recovery of these materials is important, and it is also desirable that as much heat as possible be conserved, and the ancillary processing shown serves these purposes.

Referring once more to the drawings it will be seen that the exhaust gases from the ore roasting stage 2 (comprising mainly hot air, carbon dioxide, and moisture) may be divided, a part 7 being recycled through the roasting stage to supplement the incoming hot air at 2, and a further part 8 flowing to gangue recovery apparatus of known kind 9. The recovery apparatus is fed with spent ore containing various chlorides and steam and operates at about 600° C to produce hydrogen chloride from the chlorides.

The gaseous output from the apparatus 9 flows to a hydrogen chloride recovery unit 10 having an output for recovered hydrogen chloride and an output for waste gases (mainly air).

The gaseous output 11 from the first chlorinator 3 (comprising mainly hydrogen chloride, water and impurities, and the gaseous output 12 from the reduction stage 6 (comprising mainly hydrogen chloride with water vapour and hydrogen) are fed into a hydrogen chloride recovery unit 13. The hydrogen chloride output from unit 13, and from unit 10, are fed into the main production flow at 3 and at 4, at which points additional hydrogen chloride is also added to make up for unrecovered losses.

Hydrogen gas is also recovered in the unit 13 and this is reinserted into the main production flow at 6, at which point additional hydrogen to make up the volume required is also added.

A modification of the flow described above is necessary if sintered ore is used as the starting material. In this case the roasting stage 2 and the first chlorinating stage 3 are omitted, and the sinter, shown in dotted lines at 14, is subjected directly to a full chlorinating stage at 4 at about 1000° C.

Figure 2:
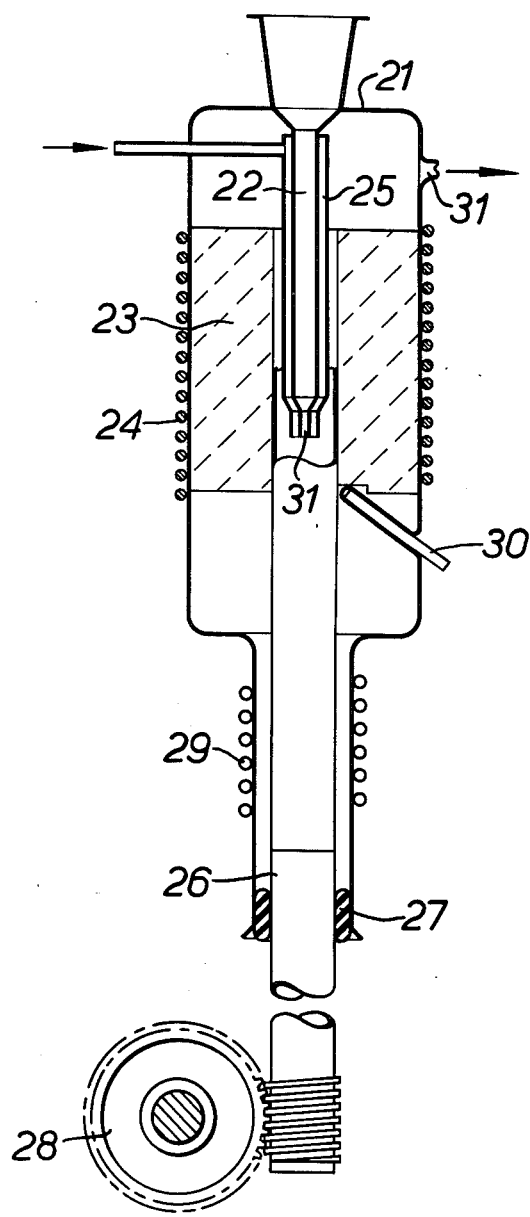
FIG. 2 shows diagrammatically a laboratory scale reduction vessel for use with the embodiment of FIG. 1.

The reduction chamber shown in FIG. 2 is a laboratory scale chamber for the continuous production of iron tube, and comprises a container 21 into which projects an inlet passage 22 for incoming gaseous iron chloride and a surrounding passage 25 for incoming hydrogen. The passages 22 and 25 are combined to constitute a venturi jet 31, fast flow of hydrogen through passage 25 creating an area of suction at the exit end of passage 22 by venturi effect, and keeping the exits from the passages clear of iron deposits.

A hollow graphite former 23, heated by an R.F. coil 24, is disposed around the jet 31.

A starter tube assembly 26 comprises a preformed metallic tube, the open end of which is arranged to project, at the commencement of operation of the apparatus, into the former 23. As an iron tube is deposited within the former 23, the starter tube 26 is withdrawn slowly from the container 21 through an annular seal 27, drawing the continuously deposited tube with it by means of a withdrawal mechanism indicated at 28.

Cooling coils 29 surround the formed tube adjacent its exits from the container 21.

The temperature within the reduction chamber, which is maintained at between 600° C and 700° C, is monitored by means of a thermocouple 30.

Waste gases exit from the container 21 by means of outlet 32.

Reaction between the iron chloride gas and the hydrogen gas takes place within the former 23, and the outlet of the jet 31 is so designed as to ensure that the reaction takes place under turbulent gas flow conditions.

By way of example of use of the invention under laboratory scale conditions a 620 cm length of iron tube of outside diameter of 20 mm wall thickness approximately 3 mm and containing approximately 200 gm of iron was produced in 60 hours. The reduction chamber was maintained at approximately 650° C and the hydrogen gas flow thereinto was of the order of 2 liters/min. The hydrogen chloride gas flow over the iron ore during chlorination was of the order of 130 ml/min.

We claim:

1. A method of producing a ferrous body comprising reacting an iron compound in a gaseous state with a reducing gas, maintaining a former at a temperature at least equal to the reduction temperature of the reaction and lower than the melting point of iron and maintaining turbulent gas flow conditions adjacent said former to deposit iron on said former as a solid ferrous body of crystalline form.

2. A method according to claim 1 wherein the former is maintained at a temperature of at least 600° C.

3. A method according to claim 2 wherein the former is maintained at a temperature of 625° C to 650° C.

4. A method according to claim 1, wherein said iron compound is an iron salt.

5. A method according to claim 4 wherein said iron compound is an iron chloride.

6. A method according to claim 1 including the step of converting an iron bearing material directly to said iron compound in a gaseous state.

7. A method of producing a ferrous body comprising reacting an iron bearing material at an elevated temperature in a first chamber with a chlorine containing gas to produce an iron chloride gas which is passed to a second chamber where it is reacted in a gaseous state with a reducing gas to produce a chlorine containing gas and iron, the iron being deposited in crystalline form on a former maintained at least at the reduction temperature of the reaction and lower than the melting point of iron and under turbulent gas flow conditions whereby the iron is deposited as a solid ferrous body.

8. A method according to claim 7 wherein the ferrous body is produced on a continuous basis.

9. A method according to claim 7 wherein the chlorine containing gas is hydrogen chloride.

10. A method according to claim 7 wherein the chlorine containing gas is chlorine gas.

11. A method according to claim 7 wherein the reducing gas is hydrogen.

12. A method according to claim 7 including means for recovering and recycling at least the majority of the chlorine containing gas.

13. A method according to claim 12 further including means for recovering chlorine remaining combined in the spent iron bearing material for re-use in the process.

14. A method according to claim 7 wherein the iron bearing material, prior to being reacted with chlorine containing gas is roasted at 400° C to 500° C to oxidise it fully and to eliminate moisture and carbon dioxide therefrom.

15. A method according to claim 7 including pretreating the iron bearing material with chlorine containing gas at approximately 150° C and then reacting the iron bearing material at 400° C to 500° C with the hydrogen chloride or chlorine gas.

16. A method according to claim 7 in which the iron bearing material is sintered iron ore and including reacting the sintered iron ore with the chlorine containing gas at approximately 1000° C.

17. A method according to claim 7 wherein the iron bearing material is reacted with a mixture of about two parts hydrogen chloride gas and one part hydrogen gas at approximately 800° C to produce said iron chloride gas.

18. A method according to claim 7 wherein additive materials for the resultant ferrous body are introduced into the reduction reaction.

19. A method according to claim 18 wherein the additive materials are introduced as gaseous compounds.

20. A method according to claim 7 wherein additive materials for the resultant ferrous body are incorporated in the iron bearing material.

21. A method according to claim 7 wherein the process is carried out at least in part at super-atmospheric pressure.

* * * * *